United States Patent
Kavanagh et al.

(10) Patent No.: US 7,205,087 B2
(45) Date of Patent: Apr. 17, 2007

(54) SOLVENTS AND PHOTORESIST COMPOSITIONS FOR 193 NM IMAGING

(75) Inventors: Robert J. Kavanagh, Natick, MA (US); James W. Thackeray, Braintree, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/418,740

(22) Filed: Apr. 18, 2003

(65) Prior Publication Data

US 2004/0029036 A1 Feb. 12, 2004

Related U.S. Application Data

(60) Provisional application No. 60/373,517, filed on Apr. 18, 2002.

(51) Int. Cl.
*G03F 7/004* (2006.01)

(52) U.S. Cl. .................. 430/270.1; 430/306; 430/320; 430/322; 430/434; 430/494

(58) Field of Classification Search ............. 430/270.1, 430/306, 322, 320, 434, 494
See application file for complete search history.

(56) References Cited

U.S. PATENT DOCUMENTS

2002/0031720 A1* 3/2002 Nakamura et al. ....... 430/270.1

* cited by examiner

*Primary Examiner*—Barbara L. Gilliam
(74) *Attorney, Agent, or Firm*—Peter F. Corless; Darryl P. Frickey; Edwards Angell Palmer Dodge LLP

(57) ABSTRACT

New photoresists are provided that are suitable for short wavelength imaging, including sub-200 nm, particularly 193 nm. Resists of the invention comprise a polymer that is preferably substantially free of aromatic moieties and comprises photoacid-labile repeat units, a photoactive components such as one or more photoacid generator compounds and a solvent component that comprises methyl isoamyl ketone (5-methyl-2-hexanone).

6 Claims, No Drawings

SOLVENTS AND PHOTORESIST COMPOSITIONS FOR 193 NM IMAGING

This application claims the benefit of U.S. Provisional Application No. 60/373,517 filed on Apr. 18 2002.

BACKGROUND OF THE INVENTION

1. Field of the Invention

The present invention relates to new photoresists that are suitable for short wavelength imaging, including sub-200 nm, particularly 193 nm. Resists of the invention comprise a polymer that is preferably substantially free of aromatic moieties and comprises photoacid-labile repeat units, a photoactive components such as one or more photoacid generator compounds and a solvent component that comprises methyl isoamyl ketone (5-methyl-2-hexanone).

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble Photoresist compositions are described in Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4.

More recently, chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have used to induce cleavage of certain "blocking" groups pendant from a photoresist binder, or cleavage of certain groups that comprise a photoresist binder backbone. See R. D. Allen et al., Proceedings of SPIE, 2724:334–343 (1996); and P. Trefonas et al. Proceedings of the 11th International Conference on Photopolymers (Soc. Of Plastics Engineers), pp 44–58 (Oct. 6, 1997).

While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 200 nm or less, particularly 193 nm (provided by an ArF exposure tool). See U.S. Pat. No. 6,306,554. Use of such short exposure wavelengths can enable formation of smaller features. Accordingly, a photoresist that yields well-resolved images upon 193 nm exposure could enable formation of extremely small (e.g. sub-0.25 µm) features that respond to constant industry demands for smaller dimension circuit patterns, e g. to provide greater circuit density and enhanced device performance.

However, many current photoresists are generally designed for imaging at relatively higher wavelengths, such as 248 nm are generally unsuitable for imaging at 193 nm. In particular, such photoresists can be highly opaque to extremely short exposure wavelengths such as 193 nm, thereby resulting in poorly resolved images.

It thus would be desirable to have new photoresist compositions, particularly resist compositions that can be imaged at short wavelengths such as sub-200 nm exposure wavelengths, particularly 193 nm.

SUMMARY OF THE INVENTION

We now provide new photoresist compositions for imaging at 193 nm that comprise a solvent component that contains methyl isoamyl ketone.

We have surprisingly found that methyl isoamyl ketone can provide excellent solvency of resist components (i.e. non-aromatic deblocking resin, photoacid generators, basic additive, surfactant, and the like), but also can provide a photoresist relief of enhanced resolution relative to a comparative photoresist that does not contain a solvent of methyl isoamyl ketone.

The methyl isoamyl ketone solvent may be present in a photoresist composition with one or more other solvents, i.e. as a blend member. Preferably, methyl isoamyl ketone will constitute a predominate portion of the total solvent component, e.g. methyl isoamyl ketone will typically constitute at least about 20, 30 or 40 volume percent of the total solvent component of a photoresist composition, more preferably at least about 50, 50, 70 80, or 90 volume percent of the total solvent component of a photoresist composition. Preferably in a solvent blend, methyl isoamyl ketone will be present in a solvating effective amount, i.e. an amount wherein the methyl isoamyl ketone itself is effective in dissolving the resist components. A solvating effective amount of methyl isoamyl ketone typically is where the methyl isoamyl solvent constitutes at least about 20, 30, 40, 50, 60, or 70 volume percent of a solvent blend, for a resist composition formulated at 85 to 90 weight percent solvent based on total weight of the resist composition.

As referred to herein, the solvent component is inclusive of the fluid materials other than solids (solids including resin, photoacid generators, basic additive, surfactant and the like) that are substantially removed during a pre-exposure soft-bake processing step.

Particularly preferred solvents to use in a blend with methyl isoamyl ketone in a photoresist of the invention include cyclohexanone and propylene glycol methyl ether acetate (PGMEA).

Other preferred solvents to use in a blend with methyl isoamyl ketone in a photoresist of the invention include ethyl lactate, diacetone alcohol, hexyl acetate, ethyl hexanoate, gamma-butyrolactone (GBL), diglyme, propylene glycol dimethyl ether, and propylene glycol methyl ether, 2-hetaptanone, 3-heptanone; ethyl-n-amyl-ketone; ethylene glycol ethyl ether; amyl acetate; methyl ethyl ketone; ethylene glycol methyl ether acetate; methylamyl acetate; ethylene glycol methyl ether acetate; ethyl-n-butyl ketone; iso-butyl isobutyrate; 2-methyl-1-pentanol (hexanol); ethylene glycol propyl ether; propylene glycol t-butyl ether; methylcaproate; ethyl caproate (ethyl hexanoate); cumene (isopropylbenzene); xylenes; anisole; ethylene glycol ethyl ether acetate; 1-tridecanol; cyclohexanol; mesitylene; hexyl acetate (2-methyl-1-pentyl acetate); diethylene glycol dimethyl ether (diglyme); diisobutyl ketone; di-n-propyl carbonate; diacetone alcohol; ethylene glycol butyl ether; and propylene glycol butyl ether.

Solvent blends of resist formulations of the invention may suitably comprise two or three or more different solvents in a single blend, more typically two or three distinct solvents.

In addition to a resin and photoactive component, resists of the invention may suitably comprise one or more other components, such as a basic additive, surfactant or leveling agent; and a plasticizer. Preferred resists of the invention also may comprise a blend of two or more resin components, and/or a blend of two or more photoacid generator compounds.

The invention also includes methods for forming relief images, including methods for forming a highly resolved relief image such as a pattern of lines (dense or isolated) where each line has vertical or essentially vertical sidewalls and a line width of about 0.40 microns or less, or even about 0.25, 0.20, 0.15, or 0.10 microns or less. In such methods, preferably a coating layer of a resist of the invention is imaged with short-wavelength radiation, particularly sub-200 nm radiation, especially 193 nm radiation. The invention further comprises articles of manufacture comprising substrates such as a microelectronic wafer having coated thereon a photoresists and/or resist relief image of the invention. The invention further includes methods methods for manufacturing such articles using a photoresist of the invention, particularly methods to manufacture a microelectronic chip using a photoresist disclosed herein. Other aspects of the invention are disclosed infra.

DETAILED DESCRIPTION OF THE INVENTION

As discussed above, new photoresist compositions are provided for 193 nm imaging that comprise a solvent that comprises methyl isoamyl ketone, a resin component that is at substantially free of aromatic substitution, and a photoactive component that suitably comprises one or more photoacid generator compounds.

As also discussed above, the solvent component may suitably consist or consist essentially of methyl isoamyl ketone, or contain multiple distinct fluids (solvent blend).

Specifically preferred solvent blends of resist compositions of the invention include:

1) a solvent blend comprising a methyl isoamyl ketone and cyclohexanone, where the methyl isoamyl ketone and cyclohexanone together preferably constitute at least 60, 70, 80, 90 or 95 or 100 volume percent of all solvent of a resist composition, and preferably where the methyl isoamyl ketone is in a greater volume amount than the cyclohexanone, preferably where the methyl isoamyl ketone:cyclohexanone volume-to-volume ratio is 2:1 or greater; and 2) a solvent blend comprising methyl isoamyl ketone and propylene glycol methyl ether acetate, where the methyl isoamyl ketone and propylene glycol methyl ether acetate together preferably constitute at least 60, 70, 80, 90 or 95 or 100 volume percent of all solvent of a resist composition, and preferably where the methyl isoamyl ketone is in a greater volume amount than the propylene glycol methyl ether acetate, preferably where the methyl isoamyl ketone:propylene glycol methyl ether acetate volume-to-volume ratio is 2:1 or greater.

Solvents used in resist compositions of the invention preferably are employed at a high purity, e.g. greater than 98 percent or 99 percent purity as may be determined by gas chromatography. Solvents used in resists of the invention also may be suitably filtered immediately prior to use.

The photoresist resin is preferably substantially free of phenyl or other aromatic groups e.g. preferred photoresist resins contain less than about 5 mole percent aromatic groups, more preferably less than about 1 or 2 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups.

Resins of the invention preferably contain repeat units that comprise alicyclic units such as polymerized norbornyl units. The alicyclic units suitably can be either carbon alicyclic units or heteroalicyclic units.

Preferred carbon alicyclic resin groups (i.e. the group has all carbon ring members) that are fused to the polymer backbone, i.e. the carbon alicyclic ring has at least two carbon ring members that comprise the polymer backbone. Preferred fused carbon alicyclic groups are provided by polymerization of cyclic olefin (endocyclic double bond) compounds such as optionally substituted norbornene groups. Suitable heteroalicyclic resin groups will contain at least one hetero atoms as a ring member, preferably 1, 2 or 3 N, O or S ring atoms, more preferably 1 or 2 oxygen or sulfur ring atoms. Preferred heteroalicyclic will be fused to the polymer backbone (i.e. at least two heteroalicyclic ring atoms as part of the polymer backbone) such as may be provided by polymerization of 3,4-dihydro-2-ethoxy-2-H-pyran. Such heteroalicyclic units may be optionally substituted by other moieties. Preferred substituents of heteroalicyclic polymer units include heteroalkyl groups such as ethers (alkoxy) preferably having 1 to about 10 carbon atoms, alkylthio preferably having 1 to about 10 carbon atoms, alkylsulfinyl preferably 1 to about 10 carbon atoms, alkylsulfonyl preferably having 1 to about 10 carbon atoms, and the like.

For use in photoresist compositions, polymers of the invention also will contain one or more units that comprise photoacid-labile moieties. The photoacid-labile group may be a substituent of one or more of the above-mentioned units, such as a substituent of a polymerized vinyl alicyclic ether, vinyl alicyclic thioether or carbon alicyclic group. The photoacid labile moiety also may be present as an additional polymer unit, e.g. as a polymerized alkyl acrylate or alkylmethacrylate, particularly an acrylate having an alicyclic moiety such as methyladamantyl acrylate or methyladamantyl methacrylate. Preferred alicyclic photoacid-labile moieties are tertiary ester alicyclic hydrocarbon groups that have two or more fused or bridged rings. Preferred tertiary ester groups include optionally substituted adamantyl, particularly methyl adamantyl as mentioned above; optionally substituted fencyl groups, particularly ethyl fencyl; optionally substituted pinanyl; and optionally substituted tricyclo decanyl, particularly an alkyl-substituted tricyclo decanyl such as 8-ethyl-8-tricyclodecanyl e.g. as provided by polymerization of 8-ethyl-8-tricyclodecanyl acrylate and 8-ethyl-8-tricyclodecanyl methacrylate. Additional alicyclic ester groups also will be suitable, including additional bicyclic, tricyclic and other polycyclic moieties.

Polymers of the invention also may contain units in addition to the above groups. For example, polymers of the invention also may contain nitrile units such as provided by polymerization of methacrylonitrile and acrylonitrile. Additional contrast enhancing groups also may be present in polymers of the invention, such as groups provided by polymermization of methacrylic acid, acrylic acid, and such acids protected as photoacid labile esters, e.g. as provided by reaction of ethoxyethyl methacrylate, t-butoxy methacrylate, t-butylmethacrylate and the like.

Generally preferred polymers of the invention contain 3, 4 or 5 distinct repeat units, i.e. preferred are terpolymers, tetrapolymers and pentapolymers that contain one or more heteroalicyclic groups as disclosed herein.

Particularly preferred resins with photoacid-labile deblocking groups for use in photoresists of the invention are disclosed in U.S. Pat. No. 6,306,554 to Barclay et al. For instance, particularly preferred polymers for use in a photoresist include tetrapolymer of: 2-(6-ethoxy)tetrahydropyran: norbornene:maleic anhydride:2-methyladmantyl (respective molar ratio of units of 10:20:30:40) and tetrapolymer of: 2-(6-methoxy)tetrahydropyran: norbornene:maleic anhdride:2-methyladmantyl (respective molar ratio of units of 10:20:30:40), which polymers are each disclosed in the examples of U.S. Pat. No. 6,306,554.

A variety of photoactive components may be employed in resists of the invention. Photoacid generators (PAGs) are generally preferred. Particularly preferred PAGs for use in resists of the invention include include onium salt compounds including iodonium and sulfonium compounds; and non-ionic PAGs such as imidosulfonate compounds, N-sulfonyloxyimide compounds; diazosulfonyl compounds and other sulfone PAGS including α,α-methylenedisulfones and disulfonehydrazines, nitrobenzyl compounds, halogenated particularly fluorinated non-ionic PAGS. Preferred PAGs do not have aromatic substitution.

More specifically, preferred iodonium PAGs include those of the following Formula I:

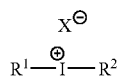

I wherein in Formula I, $R^1$ and $R^2$ are each independently optionally substituted alkyl such as $C_{1-20}$alkyl including alicyclics such as cyclohexyl, adamantly, isobornyl, norbornyl, fencyl, dodecanyl, and the like; optionally substituted carbocyclic aryl such as phenyl, naphthyl and the like; and optionally substituted heteroaromatic or heteroalicyclic such as groups having 1 to 3 separate or fused rings and 1–3 hetero atoms (N, O or S) as ring members; and X is a counter anion such as a carboxylate or sulfonate counter anion, preferably a a sulfonate (—$SO_3^-$) or carboxylate (—$COO^-$) substituted with one or more moieties such as optionally substituted alkyl preferably $C_{1-20}$alkyl, particularly $C_{1-20}$alkyl substituted with one or more electron-withdrawing groups e.g. F or other halo, nitro, cyano, etc., with perfluoruoalkyl, particularly $C_{1-10}$perfluoroalkyl being preferred; optionally substituted carbocylic aryl such as phenyl or naphthyl; optionally substituted heteroaromatic or heteroalicyclic such as groups having 1 to 3 separate or fused rings and 1–3 hetero atoms (N, O or S) as ring members.

Preferred imidosulfonate PAGs include compounds of the following Formula II:

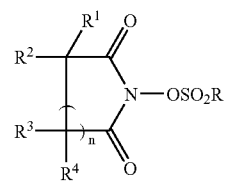

II wherein in Formula II, R is suitably by optionally substituted alkyl preferably $C_{1-20}$alkyl, particularly $C_{1-10}$alkyl substituted with one or more electron-withdrawing groups e.g. F or other halo, nitro, cyano, etc., with perfluoruoalkyl, particularly $C_{1-10}$perfluoroalkyl being preferred; optionally substituted carbocyclic aryl such as phenyl or naphthyl; optionally substituted heteroaromatic or heteroalicyclic such as groups having 1 to 3 separate or fused rings and 1–3 hetero atoms (N, O or S) as ring members;

$R^1$, $R^2$, $R^3$ and $R^4$ each independently being hydrogen or a group as defined for R, or where $R^2$ and $R^3$ are taken together and/or $R^1$ and $R^4$ are taken together to form a ring, preferably an alicyclic ring, e.g. having from 4 to about 8 ring members; and n is 1, 2, 3 or 4, preferably 1 or 2.

Preferred PAGs of Formula II include those with a fused alicyclic ring structure, such as PAGs of the following Formula IIa:

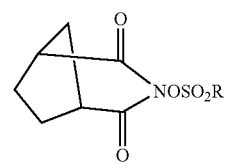

IIa wherein in Formula IIa, R, $R^1$, $R^2$, $R^3$ and $R^4$ are each the same as defined in Formula II above, with one (and preferably all) of $R^1$, $R^2$, $R^3$ and $R^4$ suitably being hydrogen is the same as defined in Formula II above; and X is methylene (—$CH_2$—), O or S. Particularly preferred PAGs of Formula IIa include those where X is methylene and R is fluorinated $C_{1-12}$alkyl, particularly perfluoro$C_{1-12}$alkyl such as —$CF_3$.

Sulfonium PAGS also will be suitable for use in resists of the invention, although perhaps less preferred than the iodonium salts and imidosulfonate compounds. For instance, preferred sulfonium PAGs include compounds of the following Formula III: IV:

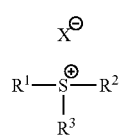

III wherein $R^1$, $R^2$ and $R^3$ are each independently selected from the same group as defined for $R^1$ and $R^2$ in Formula I above; and X is the same as defined for Formula I above.

Also preferred are ring sulfonium PAGs such as those of the following Formula

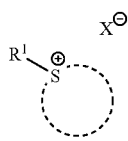

wherein $R^1$ and X are the same as defined in Formula III above; the dotted lines designate a ring structure that includes the depicted sulfur cation as a ring member, the ring suitably having 5 to about 8 ring members, and one, two or more endocyclic multiple bonds, and one or more optional ring substituents. Preferably the dotted lines form a non-aromatic ring, such as thienyl, or a completely saturated ring (no endocyclic double bonds).

In the above Formulae I, III and IV, preferred counter anions X are perfluoroalkyl and perfluoroalkoxy groups such as $C_{1-15}$perfluoroalkyl and $C_{1-15}$perfluoroalkoxy, e.g. triflate, perfluorobutanesulfonate, perfluorohexanesulfonate, perfluoroctanesulfonate, and perfluoroethoxyethylsulfonate.

A variety of other PAGs may be used in resists of the invention, including non-ionic PAGs such as substituted disulfone compounds; sulfonate compounds including N-oxyimino sulfonate compounds, α-cyano N-oxyimino sulfonate compounds; sidulfone hydrazine compounds; diazomethanedisulfone compounds; nitrobenzyl compounds; substituted acylsulfonoium compounds; and oxime sulfonate compounds including bis-N-oxyimidosulfonate compounds.

More particularly, preferred disulfone PAGs for use in resists of the invention include compounds of the following Formula V:

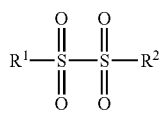

wherein $R^1$ and $R^2$ are the same as defined for Formula I above.

Preferred oxime sulfonate PAGs for use in resists of the invention include those of the following Formula VI:

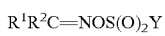

$R^1R^2C=NOS(O)_2Y$         VI wherein $R^1$ and $R^2$ may be the same as defined above for Formula I, and/or where at least one of $R^1$ and $R^2$ is an electron-withdrawing moiety such as cyano, nitro, haloalkyl particularly $C_{1-12}$haloalkyl especially $C_{1-12}$perfluoroalkyl such as —$CF_3$, —$CF_2CF_3$ and other perfluoroalkyl, alkanoyl, and the like;

Y is a non-hydrogen substituent and is suitably the same as defined for R in Formula II above.

Preferred diazosulfone PAGS for use in resists of the invention include those of the following Formula VII:

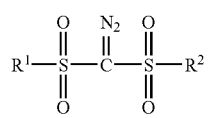

wherein $R^1$ and $R^2$ are the same as defined in Formula I above.

Preferred α,α-methylenedisulfone PAGs for use in resists of the invention include those of the following Formula VIII:

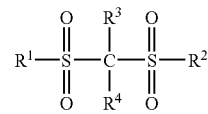

wherein $R^1$ and $R^2$ are the same or different and are other than hydrogen and are suitably the same as defined above in Formula I;

$R^3$ and $R^4$ are the same or different and may be hydrogen or a non-hydrogen substituent such as defined for $R^1$ in Formula I above, and preferably at least one of $R^3$ and $R^4$ is other than hydrogen, more preferably both $R^3$ and $R^4$ are other than hydrogen.

As mentioned above, disulfonehydrazine PAGS (i.e. hydrazine moiety interposed between the two sulfone moieties) also are suitable, preferably where the hydrazine moiety (e.g. —$N(R^3)$—$N(R^4)$— of Formula IX below) interposed between the two sulfone moieties is mono- or di-substituted with non-hydrogen substituents. Preferred disulfonehydrazine PAGS for use in resits of the invention include compounds of the following Formula IX:

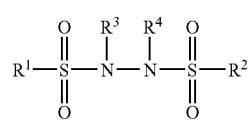

wherein $R^1$ and $R^2$ are the same or different and are other than hydrogen, and suitably are the same as defined in Formula I;

$R^3$ and $R^4$ are the same or different and may be hydrogen or a non-hydrogen substituent such as defined for $R^1$ in Formula I above, and preferably at least one of $R^3$ and $R^4$ is other than hydrogen, more preferably both $R^3$ and $R^4$ are other than hydrogen.

Further suitable PAGs for use in resists of the invention include disulfonylamine (i.e. —$SO_2$—N—$SO_2$—) salts, such as compounds of the following Formula X:

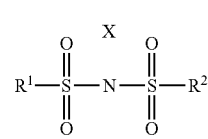

wherein $R^1$ and $R^2$ are the same or different and are other than hydrogen, and suitably are the same as defined in Formula I; and X is a counter ion.

One or more PAGS should be employed in a resist in an amount sufficient to provide a developable image upon exposure to activating radiation, such as 193 nm radiation. Suitably one or more PAGs are employed in an amount of 1 to 15 weight percent based on total solids of the resist (all components except solvent), more typically about 2 to 12 weight percent of total solids.

PAGs for use in resists of the invention can be made by generally known procedures. For instance, see U.S. Pat. Nos. 4,442,197 and 4,642,912 and European Application 0708368A1 for synthesis of iodonium PAGs. See WO 94/10608 for synthesis of N-sulfonyloxyimide PAGs. Diazosulfone PAGs can be made, e.g., by procedures disclosed in European Patent Application 0708368A1 and U.S. Pat. No. 5,558,976. See also WO 00/10056.

As discussed above, resists of the invention may suitably comprise a basic additive. The basic additive can be used in relatively small amount (e.g. 0.1 to 1, 2 or about 3 weight percent of the photoactive component) and can significantly enhance lithographic performance, particularly resolution of a developed resist relief image. Preferred base additive include salts of tetraalkyl ammonium compound such as a tetrabutylammonium salt. Additional preferred basic additives include DBU (1,8-diazobicyclo[5.4.0]undec-7-ene); DBN (1,5-diazabicyclo[4.3.0]non-5-ene; N,N-bis-(2-hydroxyethyl)piperazine; N,N-bis-(2-hydroxyethyl)-2,5-diazobicyclo[2.2.1]heptane; N-triisopropanolamin; dibutyl amine preferably branched isomers thereof such as diisobutylamine and ditertbutylamine; tributyl amine and again branched isomers thereof such as ditertbuylamine and tritertbutylamine; and the like.

Surfactant and leveling agents also may be employed in resists of the invention include e.g. silicon-containing compounds and ionic salts such as an ammonium compound. Silicon-containing compounds are generally preferred surfactant agents. Exemplary preferred surfactants and levelers include Silwet 7604 (siloxane copolymer available from Union Carbide); FC-430 (an imidosulfoante, available from 3M); RO08 (mixture containing a fluoroalcohol); Modaflow (an acrylate material). Surfactants and levelers may be suitably employed in amounts as disclosed above for dissolution inhibitor compounds.

Photoresists of the invention also may contain one or more plasticizer materials, which can inhibit or prevent undesired crazing or cracking of a deposited resist layer as well as enhance adhesion of the resist layer to an underlying material. Preferred plasticizers include e.g. materials having one or more hetero atoms (particularly S or O), and preferably materials having a molecular weight of about 20 to 1000, more typically about 20 to about 50, 60, 70, 80, 90, 100, 150, 200, 250, 300, 400 or 500, e.g. adipates, sebacates and phthalates such as bis(2-butoxyethyl)adipate; bis(2-butoxyethyl)sebacate; bis-(2-butoxyethyl)phthalate; 2-butoxyethyl oleate; diisodecyl adipate; diisodecyl glutarate; and poly(ethylene glycols) such as poly(ethyleneglycol) acrylate, poly(ethylene glycol)bis(2-ethylhexanoate), poly(ethylene glycol)dibenzoate, poly(ethylene glycol)dioleate, poly(ethylene glycol)monooleate, tri(ethylene glycol)bis(2-ethylbexanoate), and the like.

One or more plasticizer compounds may be suitably present in a resist composition in an amount of from about 0.5 to 10 or more weight percent based on total solids (all components except solvent), more preferably 0.5 to 3 weight percent of total solids of a resist.

As discussed, various moieties of PAGs, base additives and resin units, and other components of resists of the invention may be optionally substituted, typically 1, 2, or 3 positions by one or more suitable groups such as e.g. halogen (particularly F, Cl or Br); $C_{1-8}$ alkyl; $C_{1-8}$ alkoxy; $C_{2-8}$ alkenyl; $C_{2-8}$ alkynyl; hydroxyl; alkanoyl such as a $C_{1-6}$ alkanoyl e.g. acyl; carobcyclic aryl such as phenyl; and the like, although multiple carbon-carbon bonds and aromatic groups will be less preferred due to excessive absorbance of exposure radiation.

Preferred substitution groups will generally include or consist of at least one halogen atom, preferably fluorine such as fluorinated $C_{1-12}$alkyl, perfluoro$C_{1-12}$alkyl, and perfluoro$C_{1-12}$alkylene, fluorinated $C_{3-8}$cycloalkyl, and fluorinated ethers (including $C_{1-12}$ alkoxy) and esters (including $C_{1-12}$ esters) including fluorinated cyclic ethers and fluorinated cyclic esters.

As used herein, the term alkyl, alkenyl and alkynyl unless otherwise modified refers to both cyclic groups, although of course cyclic groups will comprise at least three carbon ring members. Alkoxy groups of resist components suitably have 1 to about 16 carbons and 1, 2, 3 or 4 alkoxy linkages. Suitable alkanoyl groups have I to about 16 carbons and one or more carbonyl groups, typically 1, 2 or 3 carbonyl groups. Carbocyclic aryl as used herein refers to non-hetero aromatic groups that have 1 to 3 separate or fused rings and 6 to about 18 carbon ring members and may include phenyl, naphthyl, biphenyl, acenaphthyl, phenanthracyl and the like. Phenyl and naphthyl are often preferred. Suitable heteroaromatic or heteroaryl groups will have 1 to 3 rings, 3 to 8 ring members in each ring and from 1 to about 3 hetero atoms (N, O or S). Specifically suitable heteroaromatic or heteroaryl groups include e.g. courmarinyl, quinolinyl, pyridyl, pyrimdinyl, furyl, pyrrolyl, thienyl, thiazolyl, oxazolyl, imidazolyl, indolyl, benzofuranyl and benzothiazole.

The resists of the invention can be readily prepared by those skilled in the art. For example, a photoresist composition of the invention can be prepared by dissolving the components of the photoresist in methyl isoamyl ketone, either present alone or as a blend member with one or more or distinct solvents. Typically, the solids content of the composition varies between about 5 and 35 percent by weight of the total weight of the photoresist composition, more typically 5 to about 12 or 15 weight of the total weight of the photoresist composition. The resin binder and photoactive components should be present in amounts sufficient to provide a film coating layer and formation of good quality latent and relief images.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

Following coating of the photoresist onto a surface, it is dried by heating to remove the solvent until preferably the photoresist coating is tack free Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 mJ/cm$^2$, dependent upon the exposure tool and the components of the photoresist composition.

As discussed above, coating layers of the resist compositions of the invention are preferably photoactivated by a short exposure wavelength, particularly 193 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. Plasma development also may be employed. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting example is illustrative of the invention.

EXAMPLE 1

Preparation and Lithographic Processing of a Resist of the Invention

EXAMPLE 7

Photoresist Preparation and Lithographic Processing

A photoresist of the invention is prepared by mixing the following components with amount expressed as weight percents based on total weight of the resist composition:

| Resist components | Amount (wt. % based on total solids) |
| --- | --- |
| Resin binder | 28.2 |
| Photoacid generator | 0.52 |
| Basic additive | 0.03 |
| Surfactant | 0.03 |

The resin binder is a tetrapolymer that consists of units of 2-(6-methoxy)tetrahydropyran: norbornene:maleic anhydride:2-methyladmantyl (respective molar ratio of units of 10:20:30:40). The photoacid generator is triphenylsulfonium triflate. The basic additive is triisopropnaol amine. The surfactant is Silwet (Dow Chemical). Those resist components are formulated at 16 wt. % solids in a solvent of methyl isoamyl ketone (5-methyl-2-hexanone).

The formulated resist composition is spin coated onto HMDS vapor primed 4 inch silicon wafers and softbaked via a vacuum hotplate at 130° C. for 60 seconds. The resist coating layer is exposed through a photomask at 193 nm using an ISI microstepper, and then the exposed coating layers are post-exposure baked (PEB) at about 130° C. The coated wafers are then treated with 0.26N aqueous tetramethylammonium hydroxide solution to develop the imaged resist layer and provide a relief image.

The foregoing description of the invention is merely illustrative thereof, and it is understood that variations and modifications can be effected without departing from the spirit or scope of the invention as set forth in the following claims.

What is claimed is:

1. A method for producing a photoresist relief image comprising:
    applying a coating layer of a liquid photoresist composition to a substrate, the photoresist composition comprising (i) a resin that has photoacid-labile groups and is at least substantially free of aromatic groups, (ii) a photoactive component, and (iii) a solvent component that comprises methyl isoamyl ketone and cyclohexanone,
    wherein at least 80 volume percent of all solvent of the photoresist composition is methyl isoamyl ketone and cyclohexanone and the methyl isoamyl ketone:cyclohexanone volume-to-volume ratio in the photoresist composition is 2:1 or greater;
    heating the photoressist composition layer to remove solvent;
    exposing the photoresist coating layer to patterned activating radiation through a photomask the radiation having a wavelength of about 193 nm; and
    developing the exposed resist layer.

2. The method of claim 1 wherein the solvent component includes at least three distinct solvents.

3. A method for producing a photoresist relief image comprising:
    applying a coating layer of a liquid photoresist composition to a substrate, the photoresist composition comprising (i) a resin that has photoacid-labile groups and is at least substantially free of aromatic groups, (ii) a photoactive component, and (iii) a solvent component that comprises methyl isoamyl ketone and propylene glycol methyl ether acetate,
    wherein at least 80 volume percent of all solvent of the photoresist composition is methyl isoamyl ketone and propylene glycol methyl ether acetate and the methyl isoamyl ketone: propylene glycol methyl ether acetate volume-to-volume ratio in the photoresist composition is 2:1 or greater;
    heating the photoresist composition layer to remove solvent;
    exposing the photoresist coating layer to patterned activating radiation through a photomask the radiation having a wavelength of about 193 nm; and
    developing the exposed resist layer.

4. A photoresist composition comprising (i) a resin that has photoacid-labile groups and is substantially free of aromatic groups, (ii) a photoactive component, and a solvent component that comprises a photoactive component and a solvent component that comprises methyl isoamyl ketone and cyclohexanone,
    wherein at least 80 volume percent of all solvent of the photoresist composition is methyl isoamyl ketone and cyclohexanone and the methyl isoamyl ketone:cyclohexanone volume-to-volume ratio in the photoresist composition is 2:1 or greater.

5. The photoresist composition of claim 4 wherein the solvent component includes at least three distinct solvents.

6. A photoresist composition comprising (i) a resin that has photoacid-labile groups and is substantially free of aromatic groups, (ii) a photoactive component, and (iii) a solvent component that comprises a photoactive component and a solvent component that comprises methyl isoamyl ketone and propylene glycol methyl ether acetate, wherein at least 80 volume percent of all solvent of the photoresist composition is methyl isoamyl ketone and propylene glycol methyl ether acetate and the methyl isoamyl ketone: propylene glycol methyl ether acetate volume-to-volume ratio in the photoresist composition is 2:1 or greater.

\* \* \* \* \*